(12) United States Patent
Meng

(10) Patent No.: US 9,720,465 B2
(45) Date of Patent: Aug. 1, 2017

(54) HEAT DISPERSION APPARATUS AND PORTABLE DEVICE

(71) Applicants: BOE TECHNOLOGY GROUP CO., LTD., Beijing (CN); BEIJING BOE CHATANI ELECTRONICS CO., LTD., Beijing (CN)

(72) Inventor: Yingli Meng, Beijing (CN)

(73) Assignees: BOE TECHNOLOGY GROUP CO., LTD., Beijing (CN); BEIJING BOE CHATANI ELECTRONICS CO., LTD., Beijing (CN)

(*) Notice: Subject to any disclaimer, the term of this patent is extended or adjusted under 35 U.S.C. 154(b) by 54 days.

(21) Appl. No.: 14/768,903

(22) PCT Filed: Dec. 4, 2014

(86) PCT No.: PCT/CN2014/093064
§ 371 (c)(1),
(2) Date: Aug. 19, 2015

(87) PCT Pub. No.: WO2016/029588
PCT Pub. Date: Mar. 3, 2016

(65) Prior Publication Data
US 2016/0252936 A1    Sep. 1, 2016

(30) Foreign Application Priority Data

Aug. 28, 2014   (CN) .......................... 2014 1 0432200

(51) Int. Cl.
*G06F 1/20*    (2006.01)
*H05K 7/20*    (2006.01)
(Continued)

(52) U.S. Cl.
CPC .......... *G06F 1/203* (2013.01); *F28D 15/0266* (2013.01); *F28F 3/02* (2013.01);
(Continued)

(58) Field of Classification Search
CPC ....... G06F 1/20; G06F 1/203; G06F 2200/201; H05K 7/20136–7/20172; H05K 7/20972;
(Continued)

(56) References Cited

U.S. PATENT DOCUMENTS 7,684,187 B1 * 3/2010 Meyer, IV .......... F28D 15/0233
165/104.33
8,238,100 B2 * 8/2012 Fujiwara ................. F04D 13/12
165/80.3
(Continued)

FOREIGN PATENT DOCUMENTS

CN   2580165 Y   10/2003
CN   1506791 A   6/2004
(Continued)

OTHER PUBLICATIONS

International Search Report with English translation and Written Opinion both dated May 15, 2015; PCT/CN2014/093064.
(Continued)

*Primary Examiner* — Zachary M Pape
(74) *Attorney, Agent, or Firm* — Ladas & Parry LLP

(57) ABSTRACT

A heat dissipation apparatus and a portable device are provided. The heat dissipation apparatus includes at least two heat sinks, which are connected to each other by a heat conductive tube; and a fan fixed onto one of the at least two heat sinks; the fan has an inlet vent and at least two outlet vents, the respective outlet vents have different discharging directions, a detachable shield plate is disposed at each of the outlet vents, a respective one of the outlet vents discharges an airflow outside when a respective one of the shield plates is drawn out.

19 Claims, 5 Drawing Sheets

(51) Int. Cl.
*F28F 13/06* (2006.01)
*F28F 3/02* (2006.01)
*F28D 15/02* (2006.01)
*F28D 21/00* (2006.01)
*F28F 13/00* (2006.01)

(52) U.S. Cl.
CPC ............ *F28F 13/06* (2013.01); *H05K 7/2039* (2013.01); *H05K 7/20172* (2013.01); *F28D 2021/0029* (2013.01); *F28F 2013/006* (2013.01); *F28F 2250/08* (2013.01); *F28F 2280/02* (2013.01)

(58) Field of Classification Search
CPC ........ F28F 3/02; F28F 13/06; F28F 2013/006; F28F 2250/08; F28F 2280/02; F28D 2021/0029
USPC ........ 361/679.46–679.54, 688–723; 165/126
See application file for complete search history.

(56) References Cited

U.S. PATENT DOCUMENTS

| | | | | |
|---|---|---|---|---|
| 8,514,574 | B2* | 8/2013 | Fu | G06F 1/20 165/104.33 |
| 8,693,184 | B2* | 4/2014 | Wu | G06F 1/203 165/104.33 |
| 2005/0103477 | A1* | 5/2005 | Kim | G06F 1/203 165/104.33 |
| 2008/0253080 | A1* | 10/2008 | He | F21V 29/717 361/679.48 |
| 2014/0022724 | A1* | 1/2014 | Chao | G06F 1/20 361/679.47 |

FOREIGN PATENT DOCUMENTS

| | | |
|---|---|---|
| CN | 101166406 A | 4/2008 |
| CN | 201404345 Y | 2/2010 |
| CN | 202443364 U | 9/2012 |
| CN | 102708014 A | 10/2012 |
| CN | 203167058 U | 8/2013 |

OTHER PUBLICATIONS

First Chinese Office Action dated Jun. 1, 2016; Appln. No. 201410432200.4.

Second Chinese Office Action dated Jan. 3, 2017; Appln. No. 201410432200.4.

* cited by examiner

HEAT DISPERSION APPARATUS AND PORTABLE DEVICE

The present application claims priority to Chinese Patent Application No. 201410432200.4 filed on Aug. 28, 2014 and entitled "Heat Dispersion Apparatus and Portable Device," the disclosure of which is hereby entirely incorporated by reference.

TECHNICAL FIELD

Embodiments of the present disclosure relate to a heat dispersion apparatus and a portable device.

BACKGROUND

Portable devices such as laptops, tablet PCs, navigation instruments or cell phones have advantages of being easily carried and having various of functions, and have become commonly-used living or office tools in daily life.

In the portable devices described above, power needs to be supplied to run the portable devices. A power supply device such as a lithium ion battery is an optimum choice due to its high capacity and small volume.

SUMMARY

An embodiments of the present invention provides a heat dissipation apparatus, comprising at least two heat sinks, which are connected to each other by a heat conductive tube; and a fan fixed onto one of the at least two heat sinks. The fan has an inlet vent and at least two outlet vents. The respective outlet vents have different discharging directions. A detachable shield plate is disposed at each of the outlet vents. A respective one of the outlet vents discharges an airflow outside when a respective one of the shield plates is drawn out.

In an example, the fan has a first outlet vent and a second outlet vent. Discharging directions of the first outlet vent and the second outlet vent are opposite to each other and are both perpendicular to an axial direction of the fan.

In an example, the heat dissipation apparatus further comprises a first guide fin group which is provided corresponding to the first outlet vent of the fan and is configured to guide a discharge flow from the first outlet vent, and a second guide fin group which is provided corresponding to the second outlet vent of the fan and is configured to guide a discharge flow from the second outlet vent.

In an example, the first guide fin group and the second guide fin group are respectively connected to both ends of the heat sink onto which the fan is fixed.

In an example, the first guide fin group and the second guide fin group are integrated with the heat sink onto which the fan is fixed, and the first guide fin group and the second guide fin group are respectively positioned at opposite ends of the heat sink onto which the fan is fixed.

An Embodiment of the present invention further provides a portable device, comprising the heat dissipation apparatus as provided by the above embodiments.

In an example, the portable device further comprises at least one processor and a component which needs to be kept in a certain environmental temperature so that it can be operated normally. Heat sinks of the heat dissipation apparatus, except the one onto which the fan is fixed, are affixed to the processor, so as to obtain heat generated by the processor when the portable device is in operation. One of the outlet vents of the fan of the heat dissipation apparatus is directly opposite the component and provides the component with heat after the corresponding shield plate is removed in low temperature environment.

In an example, the fan is a centrifugal fan.

In an example, the portable device further comprises a metallic cover which covers the component.

In an example, the component is a lithium ion battery.

In an example, the processor is at least one of a central processor, a display processor and an audio processor.

In an example, the portable device is a laptop, a cell phone, a navigation instrument, a tablet PC or a display with a power supply itself.

In an example, the power supply device is a lithium ion battery.

BRIEF DESCRIPTION OF THE DRAWINGS

A more detailed explanation of the embodiments of the present invention is given below with reference to the drawings, so that those skilled in the art would understand the present invention in a clearer manner. Wherein.

DETAILED DESCRIPTION

Figure 1:
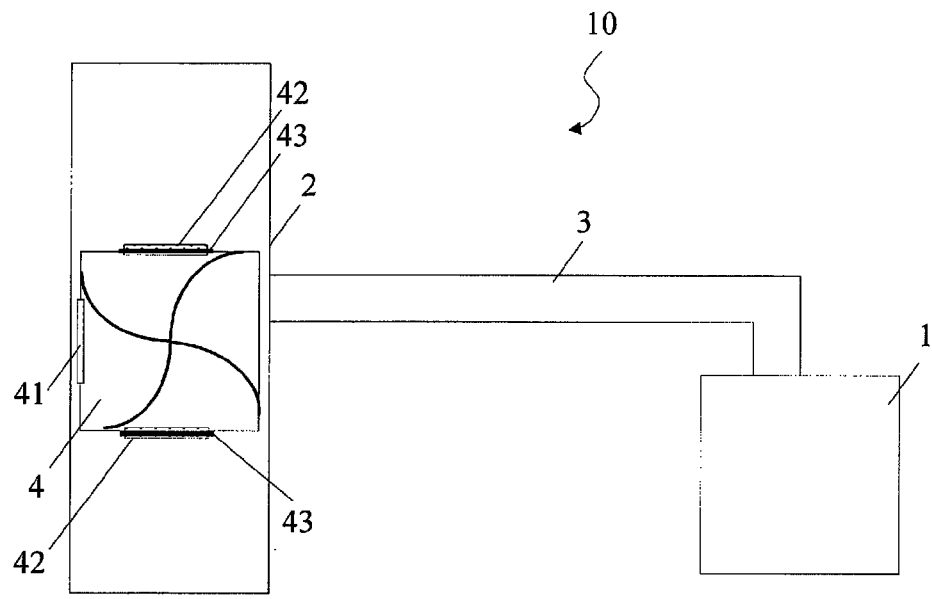
FIG. 1 is an illustrative structural view of a first heat dispersion apparatus provided by embodiments of the present invention.

Technical solutions of the embodiments of the present invention are clearly and thoroughly described below with reference to the drawings of the embodiments of the present invention. It should be noted that identical or similar reference numerals in the description denote identical or similar elements or denote elements having identical or similar functions. It is obvious that the described embodiments are just a part but not all of the embodiments of the disclosure. Based on the described embodiments herein, those skilled in the art can obtain other embodiment(s), without any inventive work, which should be within the scope of the disclosure.

Unless otherwise defined, technical terms or scientific terms as used herein should be construed as having general meanings which should be understood by those ordinary skilled in the art. Terms of "first", "second" and the like used in the description and the claims of the present application are not intended to indicate sequences, amounts or degree of importance, but are only for purpose of distinguishing various components. Likewise, terms of "one", "a" and "the" are not intended to limit the number, but indicate that there is at least one item. Words of "including" or "comprising" and the like mean that an element or an article before them contains an element/elements or an article/articles listed thereafter, while not excluding other elements or articles. Terms of "upper", "lower" and etc. are only intended to indicate relative positional relationship which may be correspondingly changed after an absolute position of the described object is changed.

The inventor has noticed that some components or power supply devices, for example, lithium ion batteries, have a characteristic of "cold fear". For example, typically, lithium ion batteries have their capacities reduced by 20% when the temperature is 0° C. and have their capacities reduced by nearly a half when the temperature is below −10° C. Therefore, in a low temperature environment, standby performance of a portable device which is powered by a lithium ion battery is dramatically deteriorated. Usage of portable devices using lithium ion batteries is limited in a low temperature environment. And at the same time, although capacities of lithium ion batteries can be gradually recovered after being placed in a normal temperature working environment, its previous usage in a low temperature environment could damage service life of the lithium ion batteries.

Embodiments of the present invention provide a heat dissipation apparatus and a portable device which can provide heat to power supply devices or batteries themselves which need to be kept in an environment temperature for proper operation, thereby ensuring that their own power devices such as batteries operates as usual.

The First Embodiment

Figure 2:
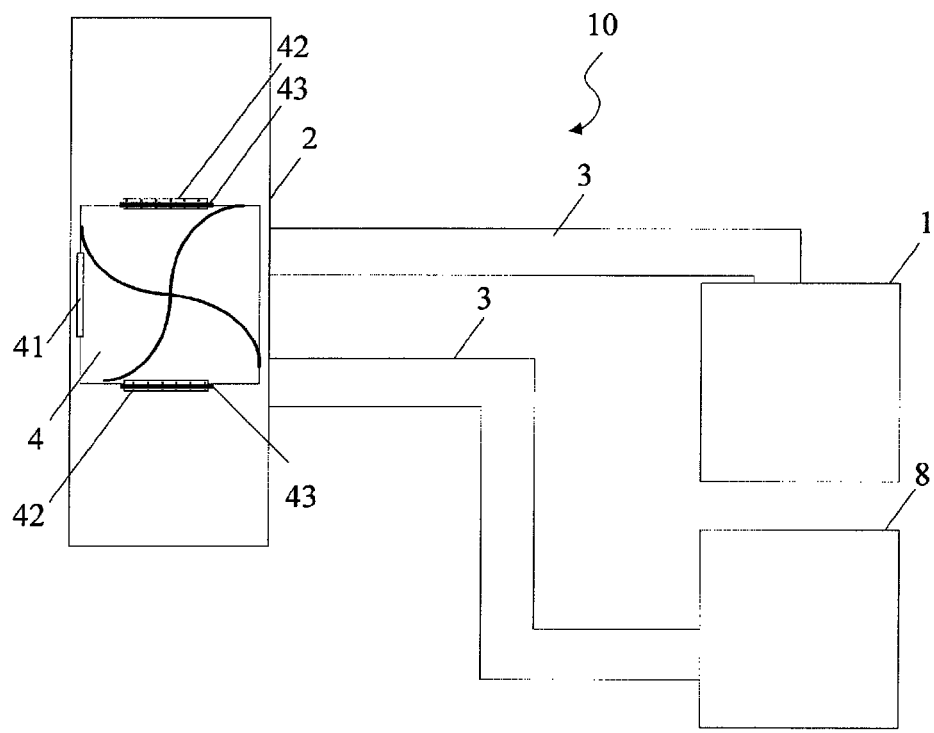
FIG. 2 is an illustrative structural view of a second heat dispersion apparatus provided by embodiments of the present invention.
Figure 3:
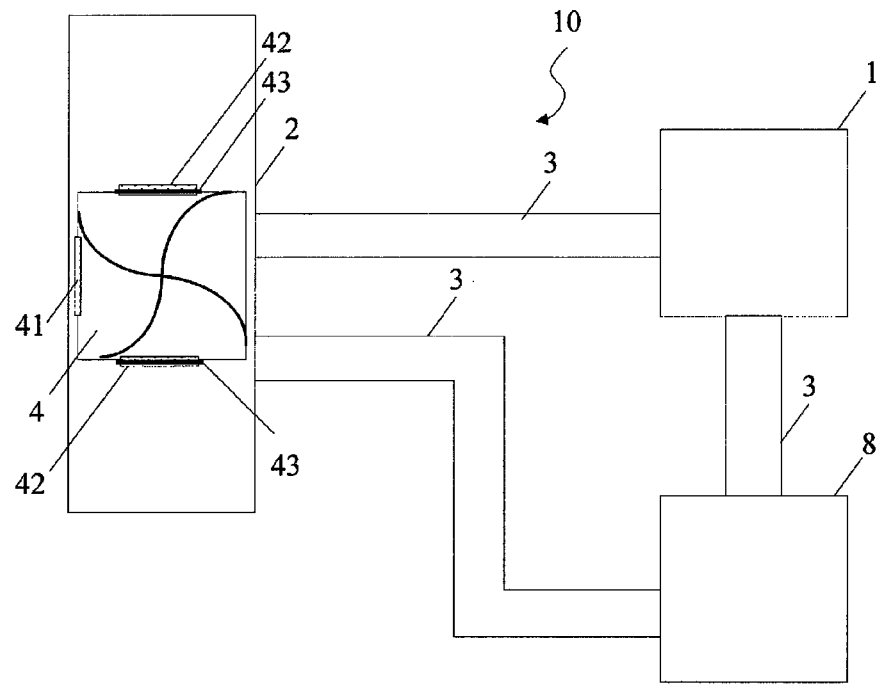
FIG. 3 is an illustrative structural view of a third heat dispersion apparatus provided by embodiments of the present invention.

With reference to FIG. 1, an embodiment of the present invention provides a heat dissipation apparatus 10 comprising at least two heat sinks, for example, a heat sink 1 and a heat sink 2. A heat conductive tube 3 connects the heat sink 1 and the heat sink 2. The heat dissipation apparatus 10 further comprises a fan, such as a centrifugal fan 4, which is fixed onto one of the heat sinks, for example onto the heat sink 2. To facilitate illustration, the heat sink 1 and the heat sink 2 as illustrated in the present embodiment are only for exemplification purpose. Heat sinks in the present invention are not limited to the two heat sinks as mentioned above, but there can be three, four or more heat sinks. As illustrated in FIG. 2 and FIG. 3, the heat dissipation apparatus 10 comprises a heat sink 1, a heat sink 2 and a heat sink 8, wherein a centrifugal fan 4 is fixed onto the heat sink 2. In FIG. 2, all the heat sinks except the heat sink 2 onto which the centrifugal fan 4 is fixed (the heat sink 1 and the heat sink 8 as illustrated in FIG. 2) are connected with the heat sink 2 by the heat conductive tubes 3. In FIG. 3, the heat sink 1, the heat sink 2 and the heat sink 8 are all connected by the heat conductive tubes 3. It should be noted that the heat sinks can have identical or different shapes.

The centrifugal fan 4 has an inlet vent 41 and at least two outlet vents 42. The outlet vents 42 have different discharging directions. A detachable shield plate 43 is disposed at each of the outlet vents 42. A respective one of the outlet vents 42 discharges an airflow outside when the respective shield plate 43 is drawn out.

It should be noted that airflow of the centrifugal fan 4 has certain directionality and has a corresponding profile. Therefore, the inlet vent 41 and the outlet vents 42 are arranged based on the airflow profile of the centrifugal fan 4, the detailed description of which is omitted here.

In the present embodiment, by providing at least two outlet vents 42, different outlet vents 42 can be selected to discharge airflow according to variation of application environments. For example, if the centrifugal fan 4 has an outlet vent A, an outlet vent B, an outlet vent C and an outlet vent D, in a normal temperature environment, the outlet vent A and the outlet vent B are selected to discharge airflow, while the shield plates 43 which are corresponding to the outlet vent C and the outlet vent D are inserted in position to prevent the outlet vent C and the outlet vent D from discharging airflow. In a low temperature environment, the outlet vent C and the outlet vent D are selected to discharge airflow, while the shield plates 43 which are corresponding to the outlet vent A and the outlet vent B are inserted in position to prevent the outlet vent A and the outlet vent B from discharging airflow.

For example, as described below regarding a portable device using such a heat dissipation apparatus, the outlet vent C and the outlet vent D are designed to discharge airflow directly to components which need to be kept in an environmental temperature for proper operation.

Figure 4:
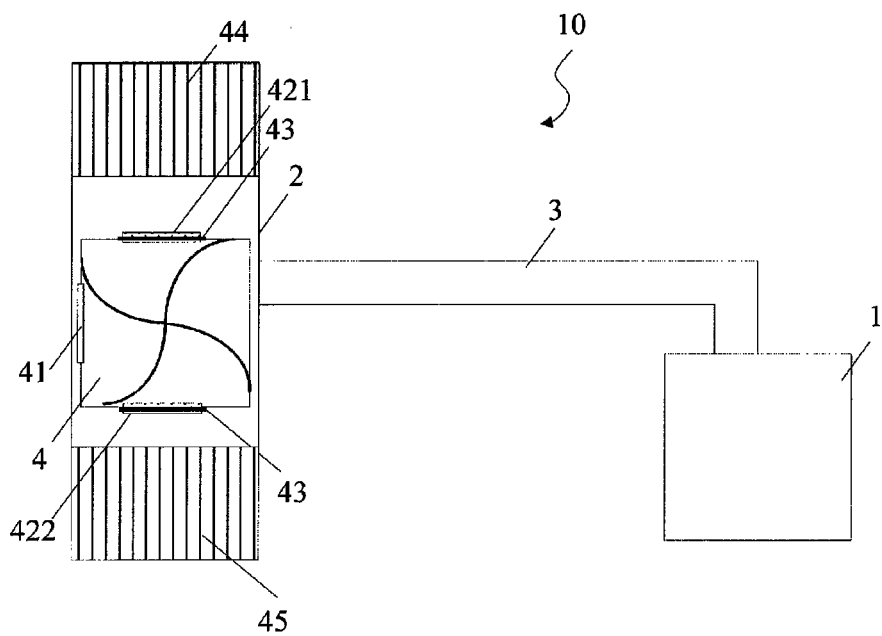
FIG. 4 is an illustrative structural view of a fourth heat dispersion apparatus provided by embodiments of the present invention.

Referring to FIG. 4, for simplification of design, for example, the centrifugal fan 4 comprises a first outlet vent 421 and a second outlet vent 422. Discharging directions of the first outlet vent 421 and the second outlet vent 422 are opposite to each other and are both perpendicular to an axial direction of the centrifugal fan 4. The axial direction of the centrifugal fan 4 is perpendicular to the heat sink 2. At the same time, to make airflows discharged from the first outlet vent 421 and the second outlet vent 422 have a better directionality, a first guide fin group 44 and a second guide fin group 45 are disposed on the heat sink 2 of the heat dissipation apparatus. The first guide fin group 44 is provided to correspond to the first outlet vent 421 of the centrifugal fan 4 for guiding a discharge airflow from the first outlet vent 421. The second guide fin group 45 is provided to correspond to the second outlet vent 422 of the centrifugal fan 4 for guiding a discharge airflow from the second outlet vent 422.

Figure 5:
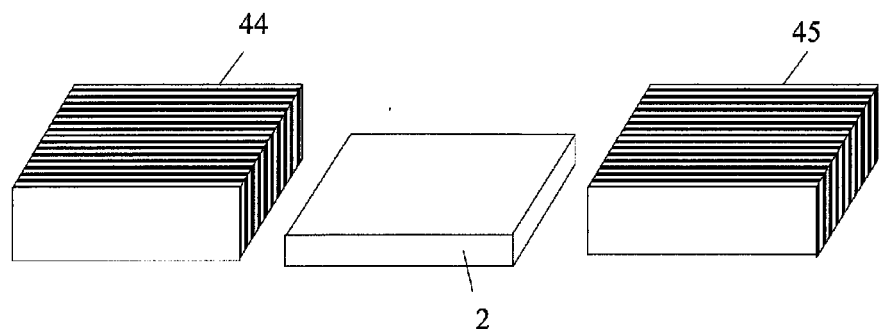
FIG. 5 is an illustrative structural view of an embodiment of the present invention in which a guide fin group and a second heat sink are separately provided.
Figure 6:
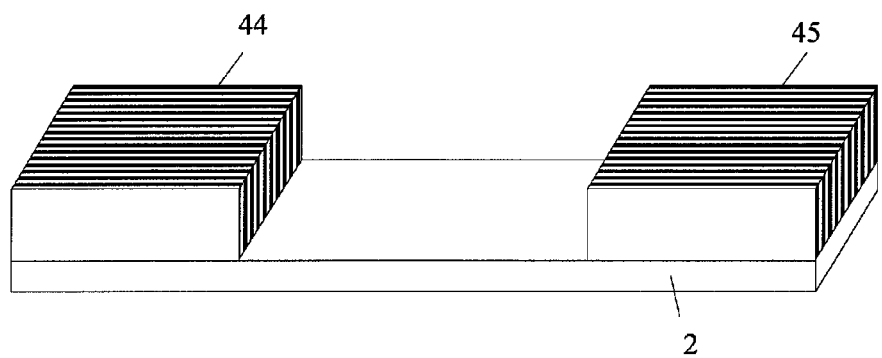
FIG. 6 is an illustrative structural view of an embodiment of the present invention in which a guide fin group and a second heat sink are integrated with each other.

The first guide fin group 44, the second guide fin group 45 and the heat sink 2 can be arranged in several manners. Referring to FIG. 5, the first guide fin group 44 and the second guide fin group 45 are designed to be separate from the heat sink 2. For example, the first guide fin group 44 and the second guide fin group 45 can be connected to both ends of the heat sink 2. In the present embodiment, the first guide fin group 44 and the second guide fin group 45 can be freely disposed and thus the design is flexible. As illustrated in FIG. 6, in consideration of easy installation, for example, the first guide fin group 44 and the second guide fin group 45 are integrated with the heat sink 2, and the first guide fin group 44 and the second guide fin group 45 are connected to opposite ends of the heat sink 2 respectively. In the present embodiment, since the first guide fin group 44, the second guide fin group 45 and the heat sink 2 form an integral structure, only an installation position needs to be considered and determined, while an adjustment of positional relationships among the respective parts is not necessary anymore.

According to the concept of the present invention, the first guide fin group 44 and the second guide fin group 45 of the present embodiment can also be disposed in the heat dissipation apparatus 10 as illustrated in FIG. 2 and FIG. 3, details of which is omitted here.

Figure 7:
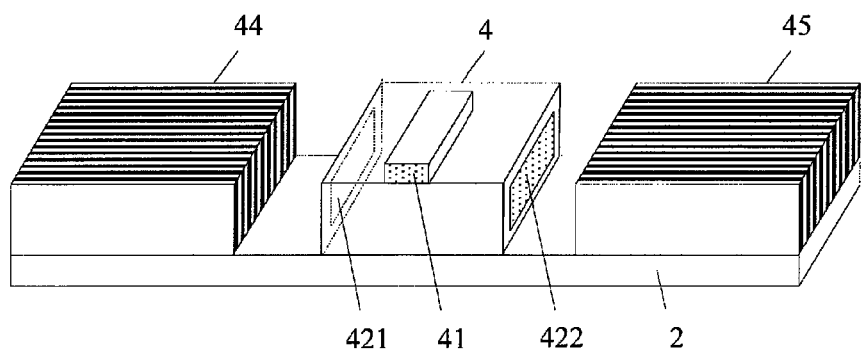
FIG. 7 is a partial stereoscopic illustrative view of the heat dispersion apparatus of FIG. 4.

Referring to FIG. 7, a partial stereoscopic illustrative view of the heat dispersion apparatus 10 is given, exemplifying that the first guide fin group 44 and the second guide fin group 45 are integrated with the heat sink 2. As illustrated, the centrifugal fan 4 comprises an inlet vent 41, a first outlet vent 421 and a second outlet vent 422. The centrifugal fan 4 is disposed on the heat sink 2. The first outlet vent 421 is directly opposite the first guide fin group 44 and the second outlet vent 422 is directly opposite the second guide fin group 45. The first outlet vent 421 and the second outlet vent 422 are each provided with the shield plate 43 as illustrated in FIG. 1 to FIG. 3. By drawing out or inserting the shield plates 43 corresponding to the first outlet vent 421 and the second outlet vent 422, the first outlet vent 421 and the second outlet vent 422 are allowed to discharge or not to discharge. When it is applied to a portable device, the first outlet vent 421 can be extended outside the device and the second outlet vent 422 is made to be directly opposite a lithium ion battery. When the environmental temperature is normal, the shield plate 43 corresponding to the first outlet vent 421 is drawn out and the shield plate 43 corresponding to the second outlet vent 422 is inserted, so that the first outlet vent 421 discharges an airflow outside of the device so as to dissipate heat. In a low temperature environment, the shield plate 43 corresponding to the first outlet vent 421 is inserted and the shield plate 43 corresponding to the second outlet vent 422 is drawn out, so that the second outlet vent 422 discharges an airflow to the lithium ion battery and thus to heat the lithium ion battery.

The advantageous effects of the embodiment of the present invention are as follows. By providing at least two outlet vents on a centrifugal fan and providing shield plates at locations of the outlet vents, different outlet vents can be selected to discharge airflow under different operation conditions of the centrifugal fan. The heat dissipation apparatus is used for portable devices. When a portable device is in a normal operation or in a low temperature environment, airflow can be discharged from different outlet vents. Especially in a low temperature environment, heat generated by at least one processor can be conducted to a second heat sink via a first heat sink and a heat conductive tube, and a lithium ion battery of the portable device can be heated by a hot airflow discharged from an outlet vent. Therefore, standby performance of the portable device in a low temperature environment is improved and damage to the lithium ion battery is reduced.

The Second Embodiment

Figure 8:
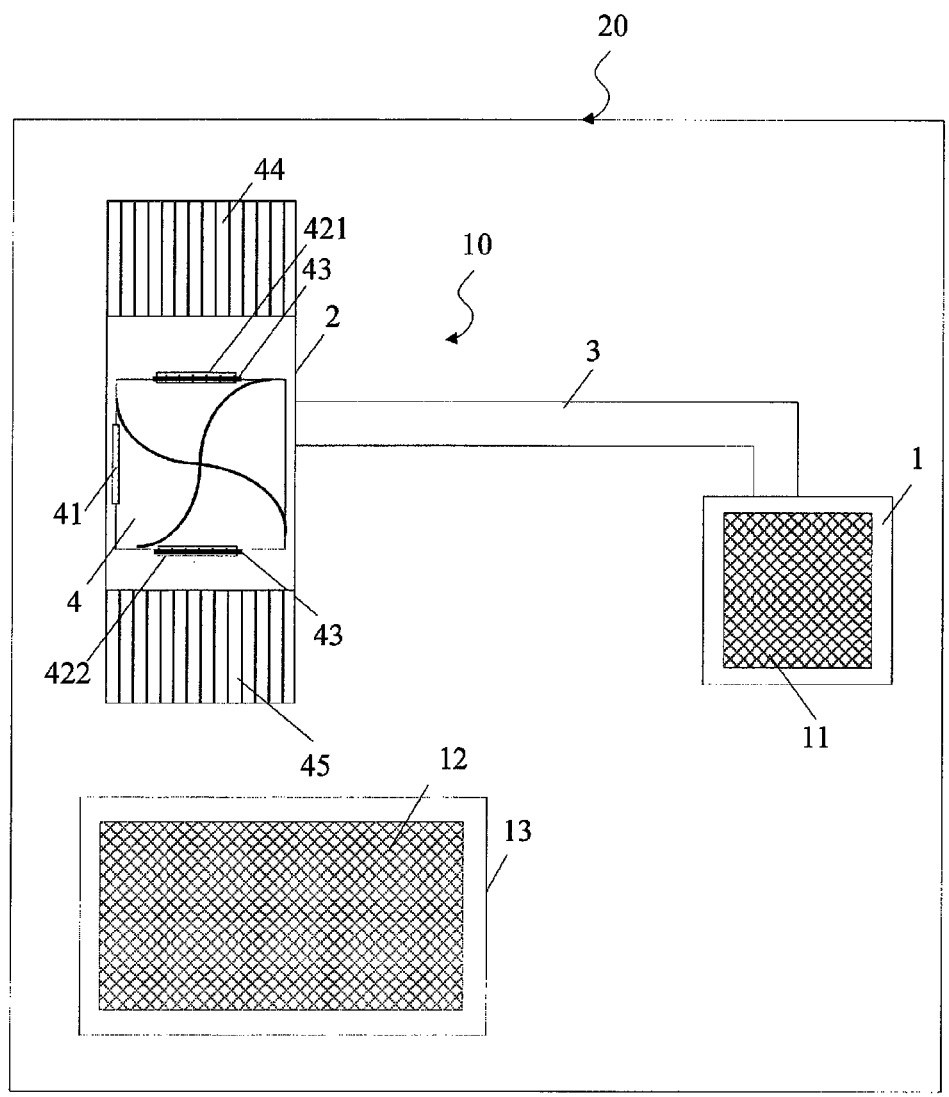
FIG. 8 is a partial illustrative structural view of a portable device provided by embodiments of the present invention.

Referring to FIG. 8, an embodiment of the present invention provides a portable device 20 comprising a heat dissipation apparatus 10 as provided by the above embodiment and further comprising at least one processor 11 (FIG. 8 only illustrates one processor 11) and a lithium ion battery 12.

Figure 9:
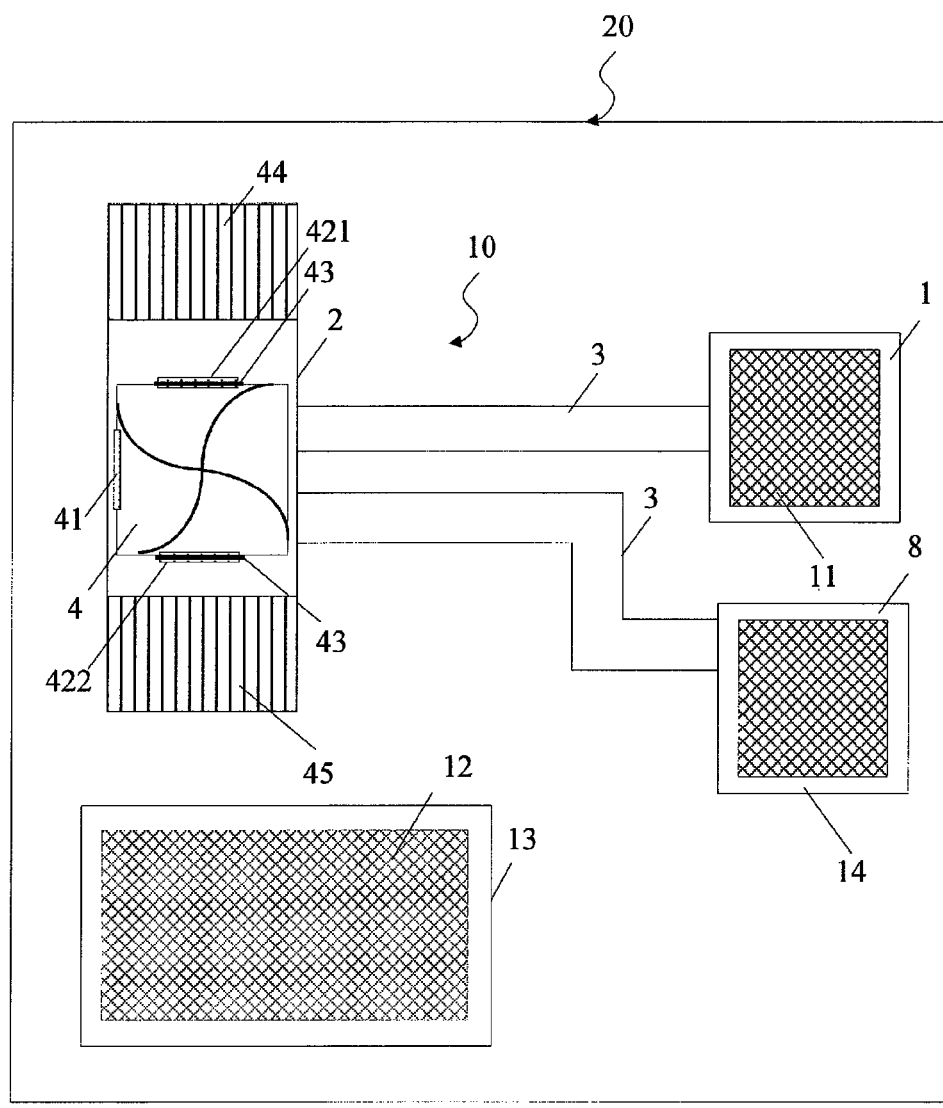
FIG. 9 is a partial illustrative structural view of another portable device provided by embodiments of the present invention.

Heat sink(s) of the heat dissipation apparatus 10, except the one to which the centrifugal fan 4 is fixed, for example the heat sink 1 as illustrated in FIG. 8, is/are affixed to the processor 11. The heat sink 1 obtains heat generated by the processor 11 when the portable device 20 is in operation. It should be noted that either a plurality of heat sinks can be affixed to one processor or a plurality of heat sinks can be affixed to a plurality of processors in a manner of one heat sink corresponding to one processor. For example, the portable device 20 as illustrated in FIG. 9 (reference numerals which are the same as those in FIG. 8 denotes the same components) comprises a processor 11 to which a heat sink 1 is affixed and a processor 14 to which a heat sink 1 is affixed.

One of outlet vents of the centrifugal fan 4 of the heat dissipation apparatus 10 (there are at least two outlet vents, i.e., the first outlet vent 421 and the second outlet vent 422 as illustrated in FIG. 8) is directly opposite a component 12, for example a lithium ion battery. The component 12 needs to be kept in a certain environmental temperature so that it can be operated normally. In the present embodiment, the second outlet vent 422 is directly opposite the component 12 which needs to be heated. The second outlet vent 422 provides the component 12 with heat after a corresponding shield plate 43 is removed in a low temperature environment. When the portable device 20 is in operation, heat sinks 1 affixed to respective processors 11 collect heat generated by the respective processors 11, which is then conducted to the heat sink 2 via the heat conductive tubes 3. When the environmental temperature is normal, the shield plate 43 corresponding to the first outlet vent 421 is drawn out and the shield plate 43 corresponding to the second outlet vent 422 is inserted, so that the first outlet vent 421 discharges an airflow to the outside of the device thereby accomplishing heat dissipation. In a low temperature environment, the shield plate 43 corresponding to the first outlet vent 421 is inserted and the shield plate 43 corresponding to the second outlet vent 422 is drawn out, so that the second outlet vent 422 discharges an airflow to the component 12 and thus to heat the component 12.

For example, a metallic cover can be disposed on the battery 12 for protecting the component such as the lithium ion battery 12 and improving heat conduction.

In the above embodiment, the component is for example a lithium ion battery or other battery or other component which can only be operated properly in a certain environmental temperature.

For example, the processor 11 is at least one of a central processor, a display processor and an audio processor.

For example, the portable device is a laptop, a cell phone, a navigation instrument, a tablet PC or a display with a power supply itself.

The advantageous effects of the embodiment of the present invention are as follows. By providing at least two outlet vents on a centrifugal fan of a portable device and providing shield plates at locations of the outlet vents, different outlet vents can be selected to discharge airflow under different operation conditions of the centrifugal fan. When the environmental temperature is normal, the shield plate 43 corresponding to the first outlet vent is drawn out and the shield plate corresponding to the second outlet vent is inserted, so that the first outlet vent discharges an airflow to the outside of the device thereby accomplishing heat dissipation. In a low temperature environment, heat generated by at least one processor can be conducted to a second heat sink via a first heat sink and a heat conductive tube, and an outlet vent can discharge a hot airflow to heat a component of the portable device which can only be operated properly in a state of being kept in a certain environmental temperature, such as a battery (for example a lithium ion battery). Therefore, standby performance of the portable device in a low temperature environment is improved and damage to the battery (for example the lithium ion battery) is reduced.

The foregoing are merely exemplary embodiments of the present invention, but are not used to limit the protection scope of the present invention. The protection scope of the present invention shall be defined by the attached claims.

The invention claimed is:

1. A heat dissipation apparatus, comprising
at least two heat sinks, which are connected to each other by a heat conductive tube; and
a fan fixed onto one of the at least two heat sinks;
wherein the fan has an inlet vent and at least two outlet vents, the respective outlet vents have different discharging directions, a detachable shield plate is disposed at each of the outlet vents, a respective one of the outlet vents discharges an airflow outside when a respective one of the shield plates is drawn out.

2. The heat dissipation apparatus according to claim 1, wherein the fan has a first outlet vent and a second outlet vent, and discharging directions of the first outlet vent and the second outlet vent are opposite to each other and are both perpendicular to an axial direction of the fan.

3. The heat dissipation apparatus according to claim 1, further comprising a first guide fin group which is provided corresponding to the first outlet vent of the fan and configured to guide a discharge flow from the first outlet vent, and a second guide fin group which is provided corresponding to the second outlet vent of the fan and configured to guide a discharge flow from the second outlet vent.

4. The heat dissipation apparatus according to claim 3, wherein the first guide fin group and the second guide fin group are respectively connected to both ends of the heat sink onto which the fan is fixed.

5. The heat dissipation apparatus according to claim 3, wherein the first guide fin group and the second guide fin group are integrated with the heat sink onto which the fan is fixed, and the first guide fin group and the second guide fin group are respectively positioned at opposite ends of the heat sink onto which the fan is fixed.

6. The heat dissipation apparatus according to claim 1, wherein the fan is a centrifugal fan.

7. A portable device, comprising the heat dissipation apparatus according to claim 1.

8. The portable device according to claim 7, further comprising at least one processor and a component which needs to be kept in a certain environmental temperature so that it can be operated properly, wherein heat sinks of the heat dissipation apparatus, except the one onto which the fan is fixed, are affixed to the processor, so as to obtain heat generated by the processor when the portable device is in operation; and
one of the outlet vents of the fan of the heat dissipation apparatus is directly opposite the component and provides the component with heat after the corresponding shield plate is removed in a low temperature environment.

9. The portable device according to claim 8, wherein the fan is a centrifugal fan.

10. The portable device according to claim 8, further comprising a metallic cover which covers the component.

11. The portable device according to claim 8, wherein the component is a lithium ion battery.

12. The portable device according to claim 8, wherein the processor is at least one of a central processor, a displaying processor and an audio processor.

13. The portable device according to claim 7, comprising a laptop, a computer, a cell phone, a navigation instrument, a tablet personal computer or a display with a power supply itself.

14. The heat dissipation apparatus according to claim 2, further comprising a first guide fin group which is provided corresponding to the first outlet vent of the fan and configured to guide a discharge flow from the first outlet vent, and a second guide fin group which is provided corresponding to the second outlet vent of the fan and configured to guide a discharge flow from the second outlet vent.

15. The heat dissipation apparatus according to claim 2, wherein the fan is a centrifugal fan.

16. The heat dissipation apparatus according to claim 3, wherein the fan is a centrifugal fan.

17. A portable device, comprising the heat dissipation apparatus according to claim 2.

18. A portable device, comprising the heat dissipation apparatus according to claim 3.

19. The portable device according to claim 9, further comprising a metallic cover which covers the component.

* * * * *